United States Patent
Herrault et al.

(10) Patent No.: US 10,032,851 B1
(45) Date of Patent: Jul. 24, 2018

(54) FORMATION OF HIGH-RESOLUTION PATTERNS INSIDE DEEP CAVITIES AND APPLICATIONS TO RF SI-EMBEDDED INDUCTORS

(71) Applicant: HRL Laboratories, LLC, Malibu, CA (US)

(72) Inventors: Florian G. Herrault, Agoura Hills, CA (US); Melanie S. Yajima, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/724,759

(22) Filed: Oct. 4, 2017

Related U.S. Application Data (62) Division of application No. 14/960,016, filed on Dec. 4, 2015, now Pat. No. 9,825,116.

(Continued)

(51) Int. Cl.
*H01L 49/02* (2006.01)
*H01L 21/288* (2006.01)
*H01L 21/027* (2006.01)
*H01L 21/308* (2006.01)
*H01L 21/3065* (2006.01)

(52) U.S. Cl.
CPC .......... *H01L 28/10* (2013.01); *H01L 21/0272* (2013.01); *H01L 21/0273* (2013.01); *H01L 21/2885* (2013.01); *H01L 21/3081* (2013.01); *H01L 21/3086* (2013.01); *H01L 21/30655* (2013.01); *H01L 28/20* (2013.01); *H01L 28/40* (2013.01)

(58) Field of Classification Search
CPC ......... H01L 28/10; H01L 28/20; H01L 28/40; H01L 21/0272; H01L 21/0273; H01L 21/3081; H01L 21/3086; H01L 21/3065; H01L 21/30655; H01L 21/2885
See application file for complete search history.

(56) References Cited

U.S. PATENT DOCUMENTS 7,501,348 B2   3/2009   Chen et al.
8,916,337 B2   12/2014  Arnold et al.
(Continued)

OTHER PUBLICATIONS

Herrault, F. "Silicon-packaged GaN power HEMTs with integrated heat spreaders" Elec. Comp. and Tech. Conf. Jul. 16, 2015 pp. 1109-1114.*

(Continued)

*Primary Examiner* — Asok K Sarkar
*Assistant Examiner* — Grant Withers
(74) *Attorney, Agent, or Firm* — Ladas & Parry (57) ABSTRACT

A method for fabricating high-resolution features in a deep recess includes etching a cavity in a substrate, fabricating at least one focusing pattern on a bottom of the cavity, wherein fabricating the focusing pattern comprises coating a first photoresist on the bottom of the cavity, patterning the first photoresist to define a focusing etch area using contact lithography, and etching the focusing etch area, coating a second photoresist on the bottom of the cavity, using the focusing pattern to focus a high resolution lithography tool at the bottom of the cavity to pattern the second photoresist to define a microfabrication feature area; and forming a microfabrication feature in the microfabrication feature area.

4 Claims, 12 Drawing Sheets

Related U.S. Application Data (60) Provisional application No. 62/131,511, filed on Mar. 11, 2015.

(56) References Cited

U.S. PATENT DOCUMENTS

| 8,980,757 | B2 | 3/2015 | Cinnor et al. |
| 9,825,116 | B1 | 11/2017 | Herrault et al. |
| 9,899,315 | B2 * | 2/2018 | Kim .................... H01L 23/5226 |

OTHER PUBLICATIONS

Burger et al., "High resolution shadow mask patterning in deep holes and its application to an electrical wafer feed-through," *Proc. Transducers 1995 Conference*, pp. 573-576, (1995).

Fischer, K., and Süss, R., "Spray coating—A solution for resist film deposition across severe topography," *IEEE/SEM/Int. Electron. Manufacturing Technol. Symp.*, pp. 338-341, (2004).

Herrault et al., "Electrodeposited metal structures in high aspect ratio cavities using vapor deposited polymer molds and laser micromachining," *Proc. Transducers 2007 Conference*, pp. 513-516, Lyon, France, (Jun. 2007).

Herrault et al., "Silicon-packaged GaN power HEMTs with integrated heat spreaders," IEEE ECTC 2015 conference, to be published, pp. 1109-1114.

Ji et al., "A metallic buried interconnect process for through-wafer interconnection," Journal of Micromechanics and Microengineering, vol. 18, No. 7, p. 085016 (10 p), pp. 1-10, (Aug. 2008}.

Margomenos et al., "Wafer-level packaging method incorporating embedded thermal management for GaN-based RF front-ends," in Proc. IEEE /Therm conference, Orlando, FL, May 27-30, 2014, pp. 976-981.

Margomenos et al., "X band highly efficient GaNpower amplifier utilizing built-in electroformed heat sinks for advanced thermal management," in IEEE International Microwave Symposium (IMS) Digest, Seattle, WA, Jun. 2-7, 2013, pp. 1-4.

Pham et al., "Photoresist coating methods for the integration of novel 3-D RF microstructures," Journal of Microelectromechanical Systems, vol. 13, No. 3, pp. 491-499, (Jun. 2004}.

Soh et al., "Ultra-low resistance, through-wafer via (TWV) technology and its applications in three dimensional structures on silicon," Japanese Journal of Applied Physics, vol. 38, pp. 2393-2396, Part 1, No. 4B, (Apr. 1999}.

Wu, R., and Sin, J.K.O., "A novel silicon-embedded careless inductor for high-frequency power management applications," IEEE Electron Device Letters, vol. 32, No. 1, pp. 60-62, (Jan. 2011).

Yu et al., "Silicon-embedding approaches to 3-D toroidal inductor fabrication," Journal of Microelectromechanical Systems, vol. 22, No. 3, pp. 580-588, (Jun. 2013).

From U.S. Appl. No. 14/960,016 (now U.S. Pat. No. 9,825,116) Restriction Requirement dated Nov. 30, 2016.

From U.S. Appl. No. 14/960,016 (now U.S. Pat. No. 9,825,116) Ex Parte Quayle Action dated Mar. 23, 2017.

From U.S. Appl. No. 14/960,016 (now U.S. Pat. No. 9,825,116) Notice of Allowance dated Jul. 21, 2017.

* cited by examiner

FROM FIG. 8A

WHEREIN FORMING THE MICROFABRICATION FEATURE INCLUDES USING AN ELECTROPLATING PROCESS OR USING A LIFT OFF PROCESS — 110

WHEREIN THE LIFT OFF PROCESS INCLUDES USING AN IMAGE REVERSAL PROCESS USING 2-MM-THICK PHOTORESIST FOR PATTERNING, EVAPORATING A LAYER OF TI, EVAPORATING A LAYER OF AU, AND REMOVING THE PHOTORESIST — 112

WHEREIN THE ELECTROPLATING PROCESS INCLUDES COATING A PHOTORESIST FOR PATTERNING, ELECTROPLATING GOLD OR OTHER METALS, AND REMOVING THE PHOTORESIST — 114

FIG. 8B

| ETCHING A CAVITY IN A SUBSTRATE OR WAFER | 200 |

| FABRICATING AT LEAST ONE FOCUSING PATTERN ON A BOTTOM OF THE CAVITY, WHEREIN FABRICATING THE FOCUSING PATTERN COMPRISES USING CONTACT LITHOGRAPHY TO DEFINE A FOCUSING ETCH AREA, AND ETCHING THE FOCUSING ETCH AREA | 210 |

| FOCUSING ON THE BOTTOM OF THE CAVITY USING THE FOCUSING PATTERN, AND | 212 |

| FORMING THE SPIRAL INDUCTOR ON THE BOTTOM OF THE CAVITY, THE SPIRAL INDUCTOR HAVING A FIRST METAL LAYER, A SECOND METAL LAYER, AND A THIRD METAL LAYER | 214 |

FROM FIG. 9A

| WHEREIN FORMING THE SPIRAL INDUCTOR INCLUDES | 216 |

| DEPOSITING A LAYER OF TITANIUM AND THEN DEPOSITING A LAYER OF GOLD INTO THE CAVITY | 218 |

| COATING A FIRST PHOTORESIST OVER THE LAYER OF GOLD | 220 |

| FOCUSING THE BOTTOM OF THE CAVITY USING THE FOCUSING PATTERN | 222 |

| FORMING FIRST OPENINGS IN THE FIRST PHOTORESIST | 224 |

| ELECTROPLATING THE FIRST METAL LAYER ON THE LAYER OF GOLD THROUGH THE FIRST OPENINGS IN THE FIRST PHOTORESIST, WHEREIN THE FIRST METAL LAYER FORMS A FIRST PAD, A SECOND PAD, AN UNDERPASS INTERCONNECT AREA, A GROUND PLANE, AND A PORTION OF THE SPIRAL INDUCTOR | 226 |

| COATING A SECOND PHOTORESIST OVER REMAINING PORTIONS OF THE FIRST PHOTORESIST AND OVER THE FIRST METAL LAYER | 228 |

| FOCUSING AT THE BOTTOM OF THE CAVITY USING THE FOCUSING PATTERN | 230 |

FROM FIG. 9B

FORMING SECOND OPENINGS IN THE SECOND PHOTORESIST 100 WHEREIN THE SECOND OPENINGS DO NOT EXPOSE THE UNDERPASS INTERCONNECT AREA ON THE FIRST METAL LAYER — 232

ELECTROPLATING THE SECOND METAL LAYER ON EXPOSED PORTIONS OF THE FIRST METAL LAYER — 234

DEPOSITING A SECOND LAYER OF TITANIUM AND THEN DEPOSITING A SECOND LAYER OF GOLD ON THE SECOND PHOTORESIST LAYER AND THE SECOND METAL LAYER — 236

SELECTIVELY ETCHING AWAY THE SECOND LAYER OF TITANIUM AND THE SECOND LAYER OF GOLD SO THAT THE SECOND LAYER OF TITANIUM AND THE SECOND LAYER OF GOLD REMAINS ONLY ON THE SECOND PHOTORESIST IN AN AREA THAT COVERS THE UNDERPASS INTERCONNECT AREA — 238

COATING A THIRD PHOTORESIST OVER THE SECOND PHOTORESIST, THE SECOND METAL LAYER AND THE REMAINING SECOND LAYER OF TITANIUM AND THE SECOND LAYER OF GOLD — 240

FOCUSING AT THE BOTTOM OF THE CAVITY USING THE FOCUSING PATTERN — 242

FROM FIG. 9C

FORMING SECOND OPENINGS IN THE THIRD PHOTORESIST TO
REMOVE THE THIRD PHOTORESIST FROM THE SECOND METAL
LAYER AND FROM THE SECOND LAYER OF TITANIUM AND THE
SECOND LAYER OF GOLD IN THE AREA THAT COVERS THE      244
UNDERPASS INTERCONNECT AREA

ELECTROPLATING THE THIRD METAL LAYER ON THE SECOND
METAL LAYER AND ON THE SECOND LAYER OF TITANIUM AND
THE SECOND LAYER OF GOLD, AND                          246

REMOVING ANY REMAINING FIRST, SECOND AND THIRD        248
PHOTORESIST

FIG. 9D

FORMATION OF HIGH-RESOLUTION PATTERNS INSIDE DEEP CAVITIES AND APPLICATIONS TO RF SI-EMBEDDED INDUCTORS

CROSS REFERENCE TO RELATED APPLICATIONS

This application claims the benefit of and is a divisional of U.S. patent application Ser. No. 14/960,016 filed on Dec. 4, 2015, the disclosure of which is incorporated herein by reference. This application relates to and claims the benefit of priority from U.S. Provisional Patent Application 62/131,511, filed Mar. 11, 2015, which is incorporated herein as though set forth in full.

STATEMENT REGARDING FEDERAL FUNDING

None.

TECHNICAL FIELD

This disclosure relates to microfabrication technologies and in particular to a method for microfabrication of radio frequency (RF) inductors inside of a deep cavity.

BACKGROUND

Advances in interposer and 3D integration technologies are enabling ultra-compact multi-chip modules. However, silicon, which is often used as a packaging material for 3D integration and microelectromechanical systems (MEMS), often represents a large volume of a wafer-level-packaged module when compared against the volume occupied by active circuitry. In order to realize ultra-compact subsystems it is therefore desirable to embed non-active components, such as passive circuits, such as resistors, capacitors and inductors, and/or MEMS devices, in the unused volume of a silicon package.

Wafer-level packaging technology for integrating GaN-on-SiC Monolithic Microwave Integrated Circuits (MMICs) with integrated heat spreaders and through-wafer interconnects has been described in References [1], [2] and [3] below, which are incorporated herein by reference. A RF wafer-level-packaged subsystem with silicon-embedded passive components and CMOS or SiGe control chips is desirable; however, there are technological challenges associated with microfabricating features within the volume of a silicon wafer. These challenges include conformal coating of a photoresist mold, as described in References [4] and [5], which are incorporated herein by reference, metallic patterning inside deep cavities, as described in References [6], [7], [8] and [9], which are incorporated herein by reference, and process resolution.

Microfabricated inductors inside the volume of silicon wafers have previously been described in References [9] and [10] below, which are incorporated by reference; however, the described embedded inductors typically operate in the 1-200 MHz frequency range. Further, the inductors have wide (50-100 μm) conductors and wide (50-100 μm) inter-conductor gaps due to fabrication limitations. Inductors such as solenoid-type designs that use through-silicon vias to form vertical interconnects have been described in Reference [11] below, which is incorporated by reference. These inductors had a peak quality factor of 18.5 at 900 MHz.

REFERENCES

The following references are incorporated herein by reference.
1. A. Margomenos, et al., "X band highly efficient GaN-power amplifier utilizing built-in electroformed heat sinks for advanced thermal management," in *IEEE International Microwave Symposium (IMS) Digest*, Seattle, Wash., Jun. 2-7, 2013, pp. 1-4.
2. A. Margomenos, et al., "Wafer-level packaging method incorporating embedded thermal management for GaN-based RF front-ends," in *Proc. IEEE ITherm conference*, Orlando, Fla., May 27-30, 2014, pp. 976-981.
3. F. Herrault, et al., "Silicon-packaged GaN power HEMTs with integrated heat spreaders," *IEEE ECTC 2015 conference*, to be published.
4. N. P. Pham, et al., "Photoresist coating methods for the integration of novel 3-D RF microstructures," *Journal of Microelectromechanical Systems*, v 12, pp. 491-499, 2004.
5. K. Fischer and R. Süss, "Spray coating—A solution for resist film deposition across severe topography," in *IEEE/SEMI Int. Electron. Manufacturing Technol. Symp.*, 2004, pp. 338-341.
6. C.-H Ji, et al., "A metallic buried interconnect process for through-wafer interconnection," *Journal of Micromechanics and Microengineering*, v 18, n 7, p 085016 (10 p), August 2008.
7. F. Herrault, et al., "Electrodeposited metal structures in high aspect ratio cavities using vapor deposited polymer molds and laser micromachining" in *Proc. Transducers 2007 Conference*, p 513-516, Lyon, France, June 2007.
8. G. J. Burger, et al., "High resolution shadow mask patterning in deep holes and its application to an electrical wafer feed-through," in *Proc. Transducers 1995 Conference*, p 573-576.
9. X. Yu, et al., "Silicon-embedding approaches to 3-D toroidal inductor fabrication," *Journal of Microelectromechanical Systems*, v 22, n 3, p 580-588, 2013.
10. R. Wu and J. K. O. Sin, "A novel silicon-embedded coreless inductor for high-frequency power management applications," *IEEE Electron Device Lett.*, vol. 32, no. 1, pp. 60-62, January 2011.
11. H. T. Soh, et al., "Ultra-low resistance, through-wafer via (TWV) technology and its applications in three dimensional structures on silicon," *Japanese Journal of Applied Physics* 38:2393-2396, 1999.

What is needed is an improved method to embed non-active components and in particular inductors in the unused volume of a silicon package. The embodiments of the present disclosure answer these and other needs.

SUMMARY

In a first embodiment disclosed herein, a method for fabricating high-resolution features in a deep recess comprises etching a cavity in a substrate or wafer, fabricating at least one focusing pattern on a bottom of the cavity, wherein fabricating the focusing pattern comprises coating a first photoresist on the bottom of the cavity, patterning the first photoresist to define a focusing etch area using contact lithography, and etching the focusing etch area, coating a second photoresist on the bottom of the cavity, using the focusing pattern to focus a high resolution lithography tool at the bottom of the cavity to pattern the second photoresist to define a microfabrication feature area; and forming a microfabrication feature in the microfabrication feature area.

In another embodiment disclosed herein, a high-resolution microfabricated feature in a deep recess comprises a cavity in a substrate or wafer, wherein the cavity has a depth of 75 μm to 100 μm, a focusing pattern on a bottom of the cavity, wherein the focusing pattern comprises a trench formed using contact lithography, and a microfabrication feature formed at the bottom of the cavity using the focusing pattern to focus a high resolution lithography tool.

In yet another embodiment disclosed herein, a method for fabricating a spiral inductor in a deep recess comprises etching a cavity in a substrate or wafer, fabricating at least one focusing pattern on a bottom of the cavity, wherein fabricating the focusing pattern comprises using contact lithography to define a focusing etch area, and etching the focusing etch area, focusing a high resolution lithography tool on the bottom of the cavity using the focusing pattern, and forming the spiral inductor on the bottom of the cavity, the spiral inductor having a first metal layer, a second metal layer, and a third metal layer.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIGS. 2A, 2B, 2C, 2D, 2E and 2F show representative images of micro-patterns in 100 μm deep silicon cavities.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure describes high-resolution microfabrication of metallic features in deep silicon recesses, and describes the design, fabrication, and characterization of microfabricated RF spiral inductors inside the deep silicon recesses. Inductors and capacitors are critical in direct current (DC) bias circuits for MMICs in order to suppress low-frequency oscillations, and it is particularly important to have these passive components as close to the MMIC as possible to minimize interconnection parasitics. The silicon-embedded passive components described in the present disclosure minimize parasitics and reduce the overall volume of RF subsystems when compared to modules using discrete passive components.

Figure 1:
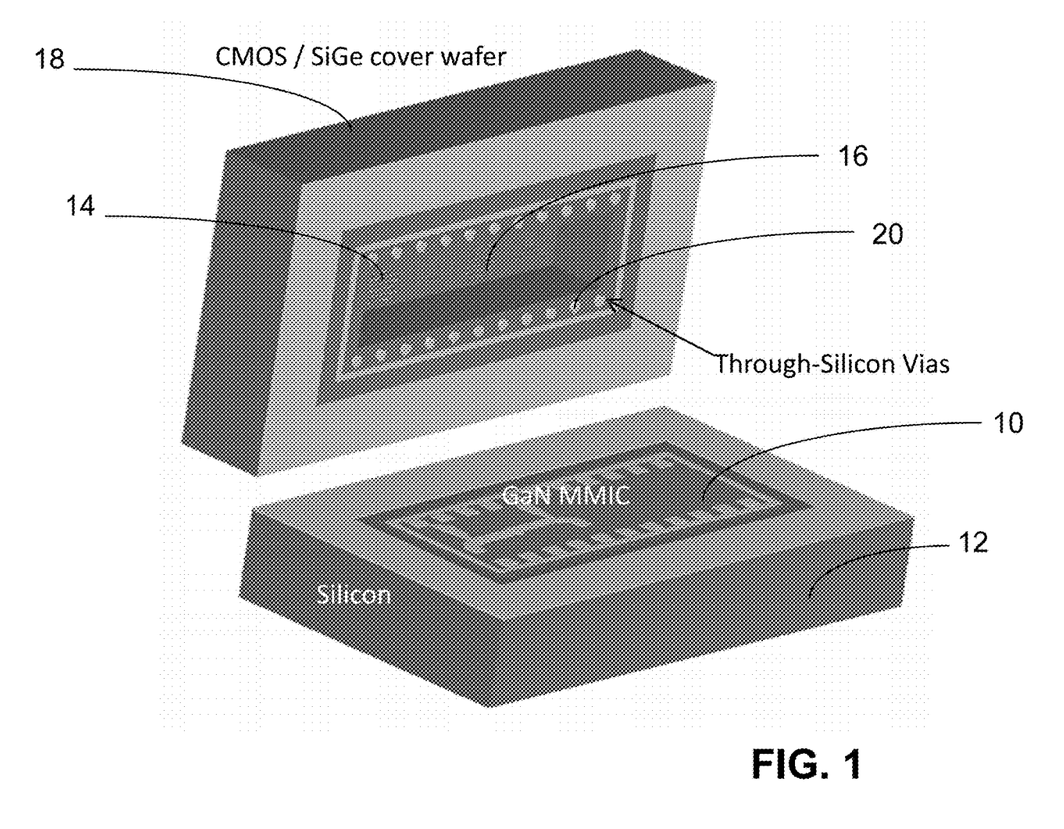
FIG. 1 shows a three dimensional conceptual rendering of a ultra-compact subsystem with a silicon packaged GaN MMIC with an embedded heat spreader, through wafer frontside interconnects, and front cover control circuitry combined with embedded RF passive components in accordance with the present disclosure.

FIG. 1 shows a three dimensional conceptual rendering of a ultra-compact subsystem with a GaN MMIC 10 packaged on silicon 12. FIG. 1 also shows silicon embedded RF passive components, including an embedded three dimensional (3D) RF capacitor 14, and an embedded RF inductor 16 in accordance with the present disclosure. The RF passive components are embedded in a CMOS/SiGe cover wafer 18, which is connected to the GaN MMIC 10 by through silicon vias 20. By packaging the RF passive components 14 and 16 on the otherwise unused area of the cover wafer 18, both the parasitics and volume are greatly reduced.

Polymeric, silicon, and metallic micro-structures may be fabricated in a cavity using a combination of one or more processes including a metal lift-off process, a metal electroplating process, and silicon etching. The cavity may be millimeter-wide and may be etched in a silicon wafer using deep reactive ion etching (DRIE) technology. The depth of the cavity may vary from 75 to 100 μm.

For a lift-off process, an image reversal process may be utilized using 2-μm-thick photoresist for patterning. Then a membrane of Ti/Au with 200 Å thick Ti and 2000 Å Au may be formed by evaporation. Then lift-off may be performed in an acetone solution.

For an electroplating process, a photoresist coating is used for patterning, and then gold or other metals may be electroplated. After electroplating the photoresist may be removed.

The deep trenches, recesses, or cavities may be formed using a silicon dry etching process. A layer of photoresist may be used to pattern the cavity. Then dry reactive ion etching (DRIE) may be used to form the cavity. DRIE may also be used to create three-dimensional micro-structures.

Figure 2A:
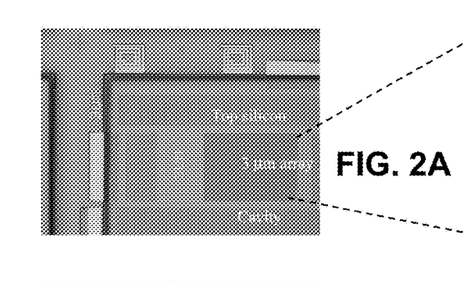
FIG. 2A shows a microscope photograph of photoresist patterns and FIG. 2B shows a detailed image of a portion of FIG. 2A using a scanning electron microscope (SEM)
Figure 2B:
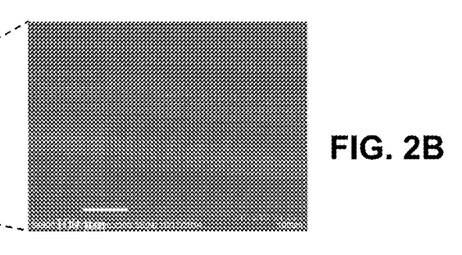
Figure 2C:
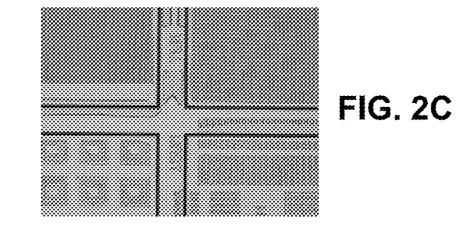
FIGS. 2C and 2D show images of electroplated gold patterns.
Figure 2D:
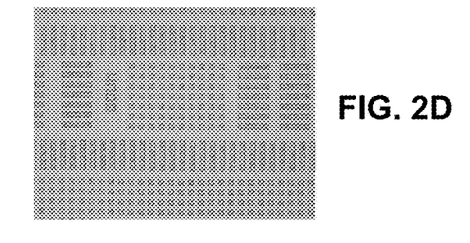
Figure 2E:
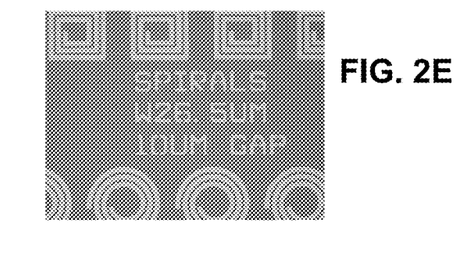
FIG. 2E shows an image of a lifted off Ti/Au pattern.
Figure 2F:
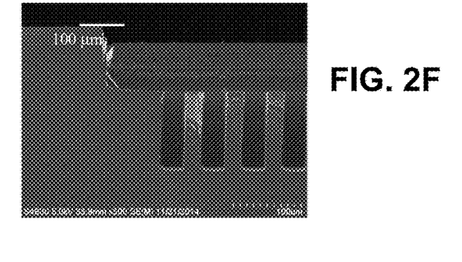
FIG. 2F shows a cross-section image of micro-trenches formed using dry etching in accordance with the present disclosure.

FIGS. 2A, 2B, 2C, 2D, 2E and 2F show representative images of micro-patterns in 100 μm deep silicon cavities. FIG. 2A shows a microscope photograph of photoresist patterns with a 3 μm pitch array and FIG. 2B shows a detailed image of a portion of FIG. 2A using a scanning electron microscope (SEM). FIGS. 2C and 2D show images of a 5 μm thick electroplated gold patterns illustrating the electroplating process. FIG. 2E shows an image of a 0.2 μm thick lifted off Ti/Au pattern illustrating the lift-off process. FIG. 2F shows a cross-section image of micro-trenches formed using dry etching inside a mm-wide trench illustrating the silicon dry etch process. These images show that feature resolution of 3 μm may be achieved using the lift-off and using the electroplating process. Using the silicon dry etch process, 10 μm diameter and 30 μm deep microtrenches may be formed inside the 100 μm deep silicon cavities. Such results compare favorably to those described in References [6], [7], [8] and [9] above.

To achieve high resolution features inside a deep silicon trench a high-performance lithography tool, such as a Canon® stepper, may be used. Through the methods described in the present disclosure, the lithography tool can focus at the bottom of the cavities in order to fabricate high-resolution features.

Figure 4A:
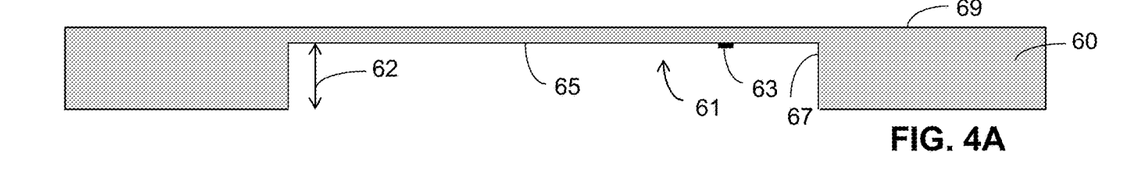
FIGS. 4A, 4B, 4C, 4D and 4E show a fabrication process flow for fabricating a microfabricated spiral inductor inside a deep silicon cavity in accordance with the present disclosure.

After the cavity, recess, or trench 61 is formed in the silicon substrate or wafer 60, as shown in FIG. 4A, using dry etching, focusing patterns 63 are fabricated at the bottom 65 of the cavity 61, which may have a depth of 75 to 100 μm. The focusing patterns 63 may be fabricated using contact lithography using a combination of photoresist coating, for example spray coating of AZ4620, and using a contact aligner to pattern the photoresist, and then dry etching. The dry etching may be performed using dry reactive ion etching. Contact lithography, also known as contact printing, is well known in the art and is a form of photolithography whereby the image to be printed is obtained by illumination of a photomask in direct contact with a substrate coated with an imaging photoresist layer. Once the focusing patterns are dry etched into the cavity 61, the photoresist may be removed. The focusing patterns 63 have relatively poor resolution, because they are fabricated using prior art shadow mask and standard contact exposure methods, which suffer from physical air gaps between the patterned mask and the photoresist. These air gaps result in diffraction issues and therefore low process resolution. However, the focusing patterns 63 enable dynamic focusing of the Canon® stepper inside the recesses, or cavities. Any surface topography of the focusing patterns 63 may be used and is suitable for focusing of the Canon® stepper. In a silicon wafer with an 100 micron deep cavity, focusing patterns 63 dry etched to a depth of 1 micron or less have been shown to be effective for providing features to enable focusing of the Canon® stepper on the bottom 65 of the cavity 61.

Following etching of the cavity 61 and fabrication of the low resolution focusing patterns 63, high resolution features in the cavity may be fabricated. FIGS. 4A to 4E show the process flow for fabricating a spiral RF inductor, as shown in FIG. 3, in the cavity 61.

Figure 3:
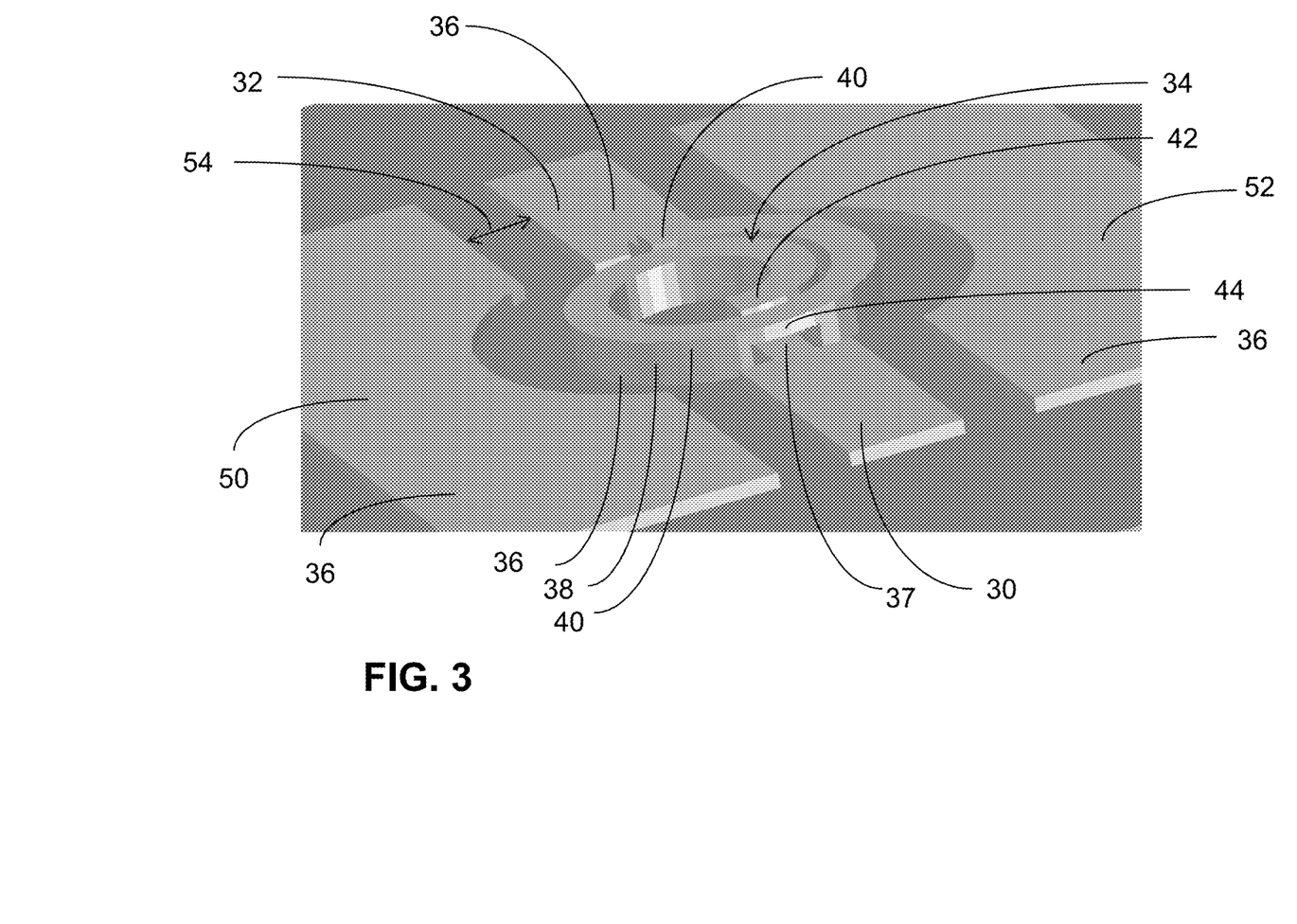
FIG. 3 shows a three dimensional microfabricated three layer spiral inductor in accordance with the present disclosure.

The RF inductor of FIG. 3 has a coplanar waveguide (CPW) pad 30 to feed a spiral multi-turn planar inductor 34, and another CPW pad 32 for the output of the inductor. The RF inductor of FIG. 3 has three metal (MET) layers, which are MET 1 layer 36, MET 2 layer 38 and MET 3 layer 40. The MET 1 layer 36 provides the CPW 30, the CPW 32, the underpass interconnect 37, which connects CPW 30 to the center 42 of the spiral inductor, ground plane 50, ground plane 52, and a portion of the spiral inductor 34. The MET 2 layer 38 provides another portion of the spiral inductor 34. The MET 2 layer 38 is removed and is not present above the underpass interconnect 37 to provide an air gap between the MET 1 layer 36 at the underpass interconnect 37 and the MET 3 layer 40, thereby providing a way to connect the CPW 30 to the center 42 of the spiral inductor. The MET 3 layer 40 provides yet another portion of the spiral inductor 34. The RF inductor design, shown in FIG. 3, maximizes the cross-sectional area of the conductors using the thick electroplated metal layers MET 1 layer 36, MET 2 layer 38, and MET 3 layer 40.

The CPWs 30 and 32 have a width of 80 μm for the signal line and a 50 μm signal-to-ground lateral gap 54, which matches the impedance to the 50 Ohm impedance on the 300-μm-thick silicon substrates. A particular RF inductor design may vary in inner diameter, conductor width, inter-conductor gap, and number of turns. However, as a representative example, the RF inductor shown in FIG. 3 has 1.5 turns with a 30 μm wide conductor, a 10-μm-wide interconductor gap, and an inner diameter of 40 μm.

FIGS. 4A, 4B, 4C, 4D and 4E show process flow steps for microfabrication of gold-plated spiral inductors inside a deep silicon trench. Because a wafer frontside may have CMOS/SiGe active circuits and through-wafer interconnects, as shown in FIG. 1, all the process steps of FIGS. 4A to 4E may be performed on the backside of the wafer.

First, a silicon etching mask consisting of a 0.5 μm thick plasma-enhanced chemical vapor deposition (PECVD) silicon dioxide and 10-μm-thick positive-tone photoresist (AZ4620) is patterned using photolithography to define the cavity 61 in the silicon wafer 60. Then the cavity 61, as shown in FIG. 4A, with a depth 62 ranging from 75 to 100 μm is etched in the silicon wafer 60 using deep reactive ion etching (DRIE) and a Bosch process configuration, which are understood by those skilled in the art, to achieve straight sidewalls 67.

Then, as described above, low resolution focusing patterns 63 are fabricated on the bottom 65 of the cavity 61 using prior art shadow mask and standard contact exposure methods.

Next, the photoresist used to define the cavity is removed using standard solvent baths. Then a titanium/gold seed layer of 200 Å Ti and 3000 Å Au, respectively, is sputtered on the wafer 12 and into the cavity 61.

Figure 4B:
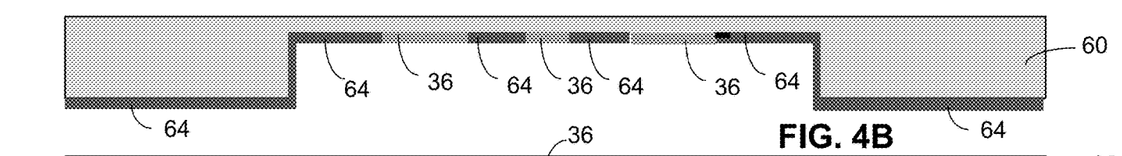

Then as shown in FIG. 4B, a positive-tone photoresist 64 is coated onto the wafer, preferentially by using a spray coating technique. The photoresist 64 may or may not be coated over the focusing patterns 63. Pre-defined silicon-etched alignment marks on the top surface 69 of the wafer 12 may be used for coarse alignment of patterning of the photoresist 64, and then high resolution lithography tool focusing may be performed at the bottom 65 of the cavity 61 using the focusing patterns 63, thereby enabling high-resolution patterning of the photoresist 64 coating inside the deep silicon cavity 61. The patterned photoresist 64 may have a thickness of about 6 μm. Then, as shown in FIG. 4B, the MET 1 layer 36 of 5.5 μm of gold, which as described above provides portions of the RF inductor shown in FIG. 3, is electroplated through openings in the photoresist 64. The MET 1 layer 36 provides the CPW 30, the CPW 32, the underpass interconnect 37, which connects CPW 30 to the center 42 of the spiral inductor, ground plane 50, ground plane 52, and a portion of the spiral inductor 34, as shown in FIG. 3.

Figure 4C:
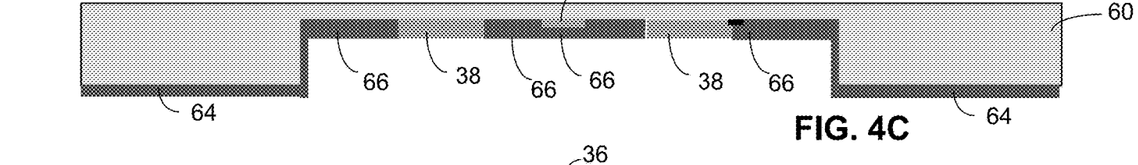

Next as shown in FIG. 4C, a second layer of photoresist 66 is coated over the remaining portions of photoresist 64 and over the MET 1 layer 36. The photoresist 66 may or may not be coated over the focusing patterns 63. The pre-defined silicon-etched alignment marks on the top surface 69 of the wafer 12 may again be used for coarse alignment of the patterning of photoresist 66, and then high resolution lithography tool focusing using the focusing patterns 63 may be performed, thereby enabling high-resolution patterning of the photoresist 66. Then the MET 2 layer 38 is electroplated on the exposed portions of MET 1 layer 36. The MET 1 layer 36 in the underpass interconnect 37 area is purposely covered by photoresist 66, so that MET 2 layer 38 is not electroplated onto the MET 1 layer 36 in the underpass interconnect 37 area. The photoresist layer 66 and the MET 2 layer 38 may have the same or about the same thicknesses as utilized for the photoresist layer 64 and the MET 1 layer 36, or 6 µm and 5.5 µm, respectively. The second metallic layer MET2 may also be gold. The MET 2 layer 38 provides another layer of the spiral inductor 34, as shown in FIG. 3.

After electroplating of MET 2 layer 38, a Ti/Au seed layer may be sputtered on the photoresist layer 66 and the MET 2 layer 38. Then the Ti/Au seed layer may be selectively etched away using a combination of ion milling and diluted hydrofluoric acid so that the Ti/Au seed layer remains only on the photoresist 66 in the area 67 which covers the underpass interconnect 37.

Figure 4D:
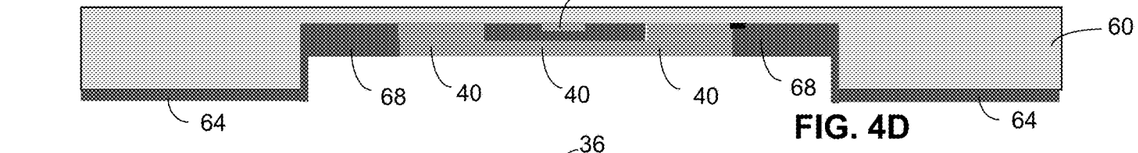

Next, as shown in FIG. 4D, photoresist 68 is deposited over the photoresist 66, the MET 2 layer 38 and the Ti/Au seed layer in area 67. The photoresist 68 may or may not be deposited over the focusing patterns 63. The pre-defined silicon-etched alignment marks on the top surface 69 of the wafer 12 may again be used for coarse alignment of patterning of the photoresist 68, and then high resolution lithography tool focusing may be performed using the focusing patterns 63, thereby enabling high-resolution patterning of the photoresist 68 to remove the photoresist 68 from MET 2 layer 38 and from the Ti/Au seed layer in area 67. Then, MET 3 layer 40 is electroplated on MET 2 layer 38 and on the Ti/Au seed layer in area 67, as shown in FIG. 4D. The MET 3 layer 40 provides another layer of the spiral inductor 34, as shown in FIG. 3.

Figure 4E:
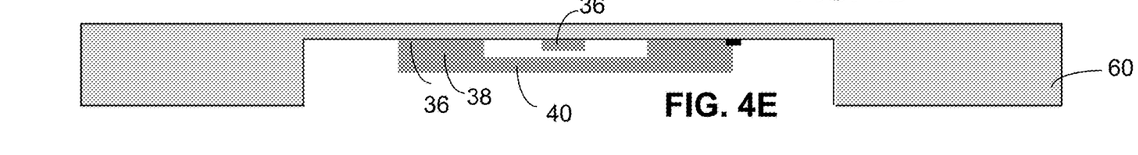

Finally, as shown in FIG. 4E the remaining photoresist layers 68, 66, and 64 are removed. The Ti/Au seed layer may also be removed to complete the inductor fabrication sequence, as shown in FIG. 4E.

Figure 5A:
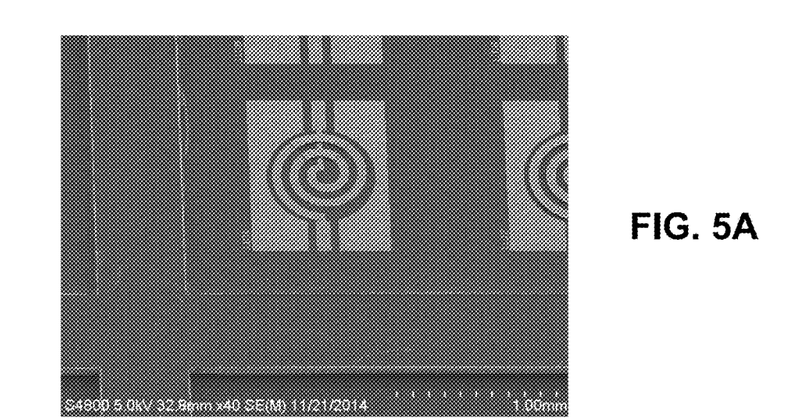
FIGS. 5A and 5B show a microscope photograph and a SEM image of a microfabricated spiral inductor, respectively, inside a deep silicon cavity in accordance with the present disclosure.
Figure 5B:
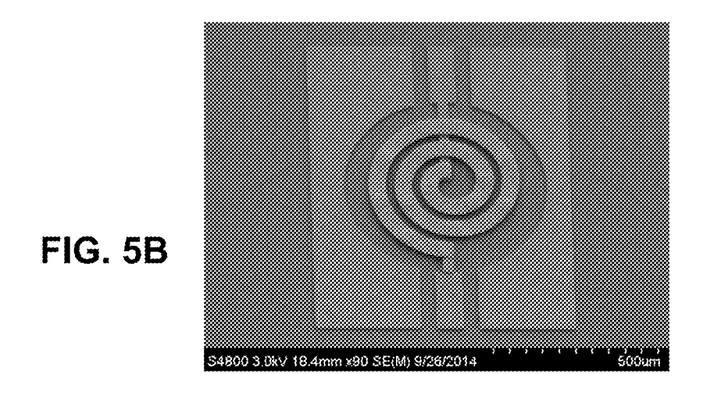

Microscope and SEM images of microfabricated inductors inside deep silicon cavities are shown in FIGS. 5A and 5B, respectively.

Figure 6:
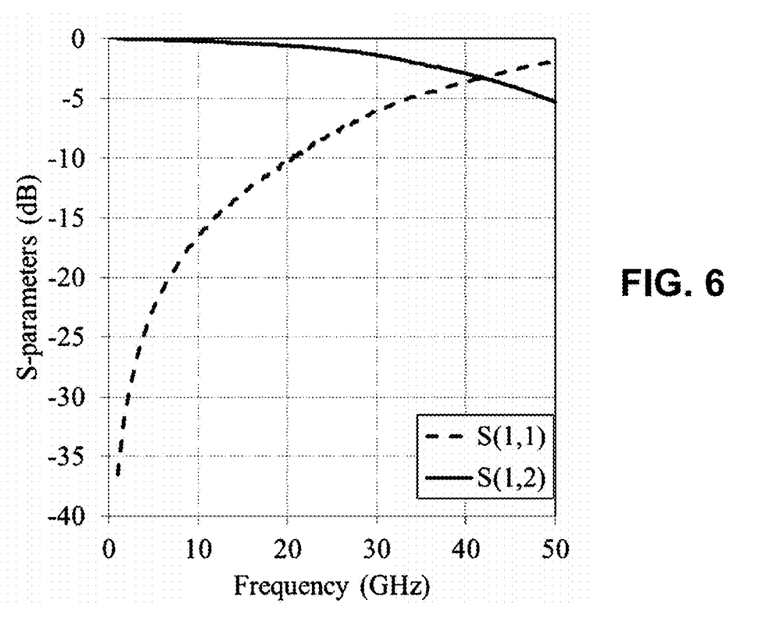
FIG. 6 shows the measured S-parameters for a 1.5 turn inductor as a function of frequency for a 1.5-turn inductor microfabricated inside a 100 μm deep silicon cavity in accordance with the present disclosure.
Figure 7:
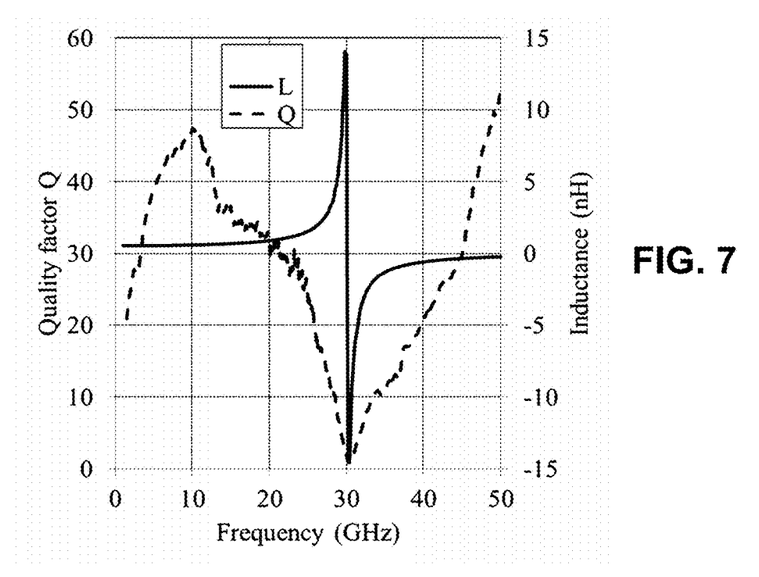
FIG. 7 shows the measured inductance and quality factor as a function of frequency for a 1.5-turn inductor microfabricated inside a 100 μm deep silicon cavity in accordance with the present disclosure.
Figure 8A:
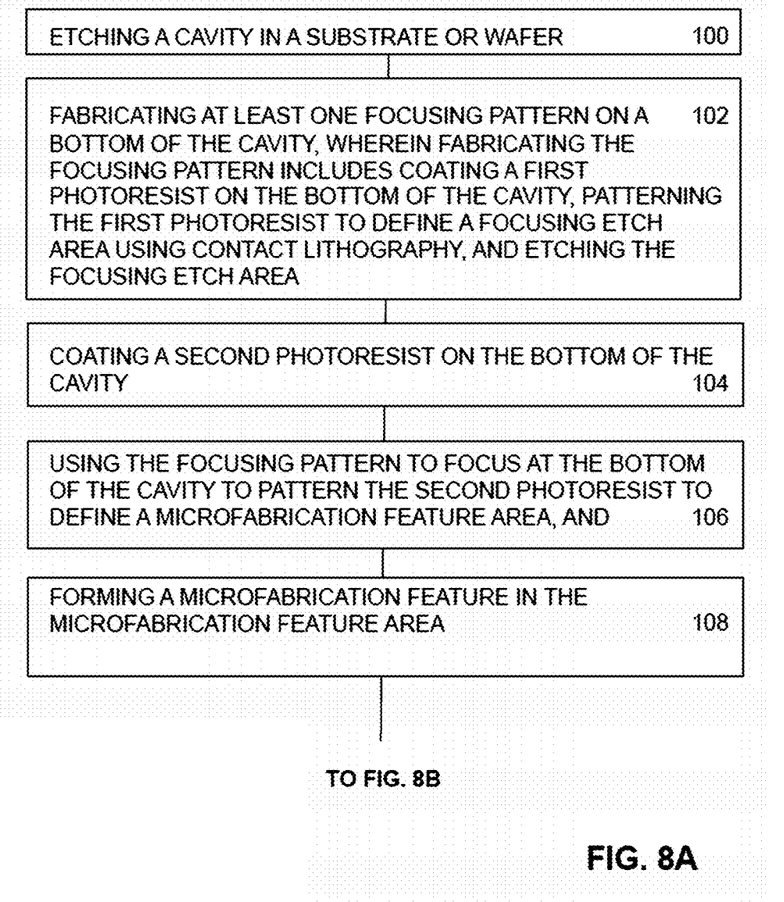
FIGS. 8A and 8B show a method for fabricating high-resolution features in a deep recess with steps 100, 102, 104, 106, 108, 110, 112 and 114 in accordance with the present disclosure.
Figure 8B:
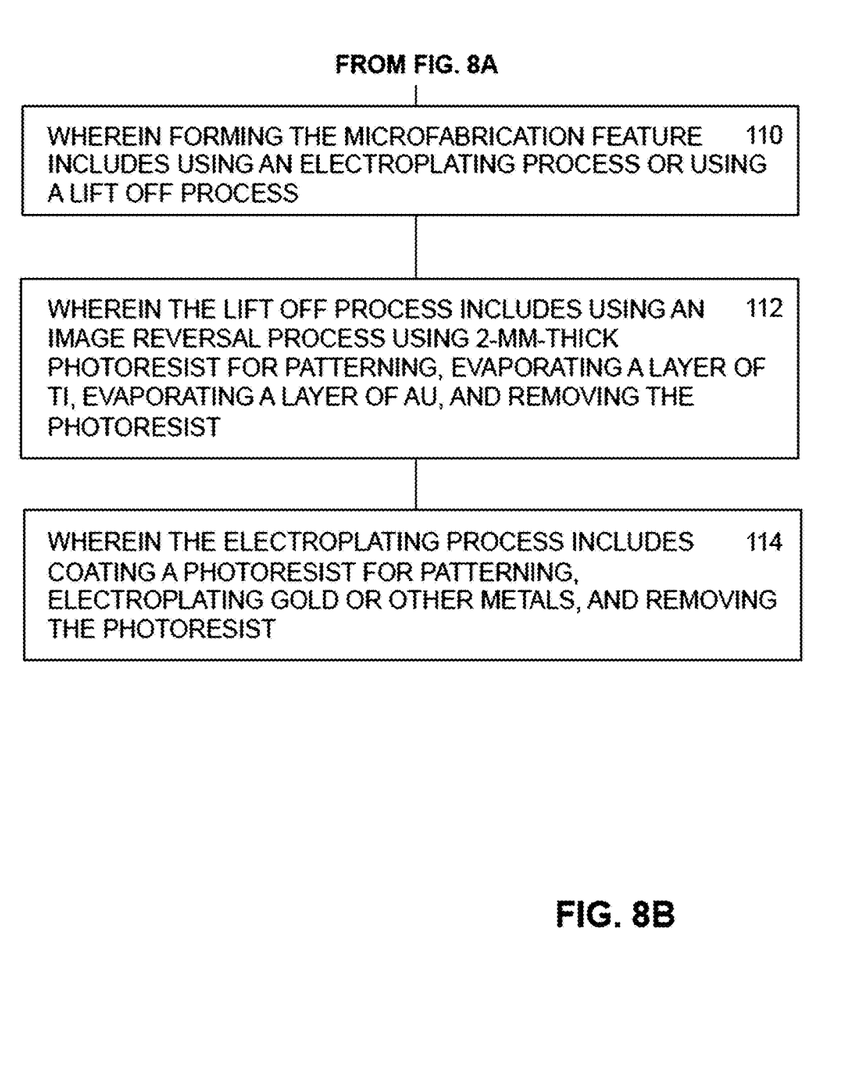
Figure 9A:
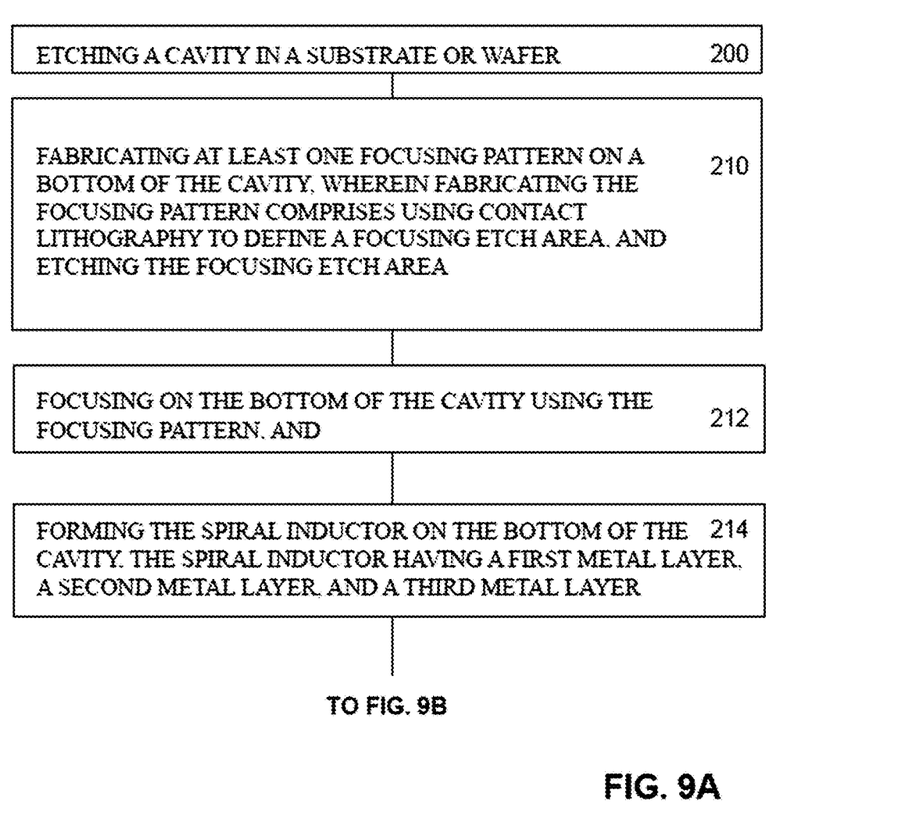
FIGS. 9A, 9B, 9C and 9D show a method for fabricating a spiral inductor in a deep recess with steps 200, 202, 204, 206, 208, 210, 212, 214, 216, 218, 220, 222, 224, 226, 228, 230, 232, 234, 236, 238, 240, 242, 244, 246 and 248 in accordance with the present disclosure.
Figure 9B:
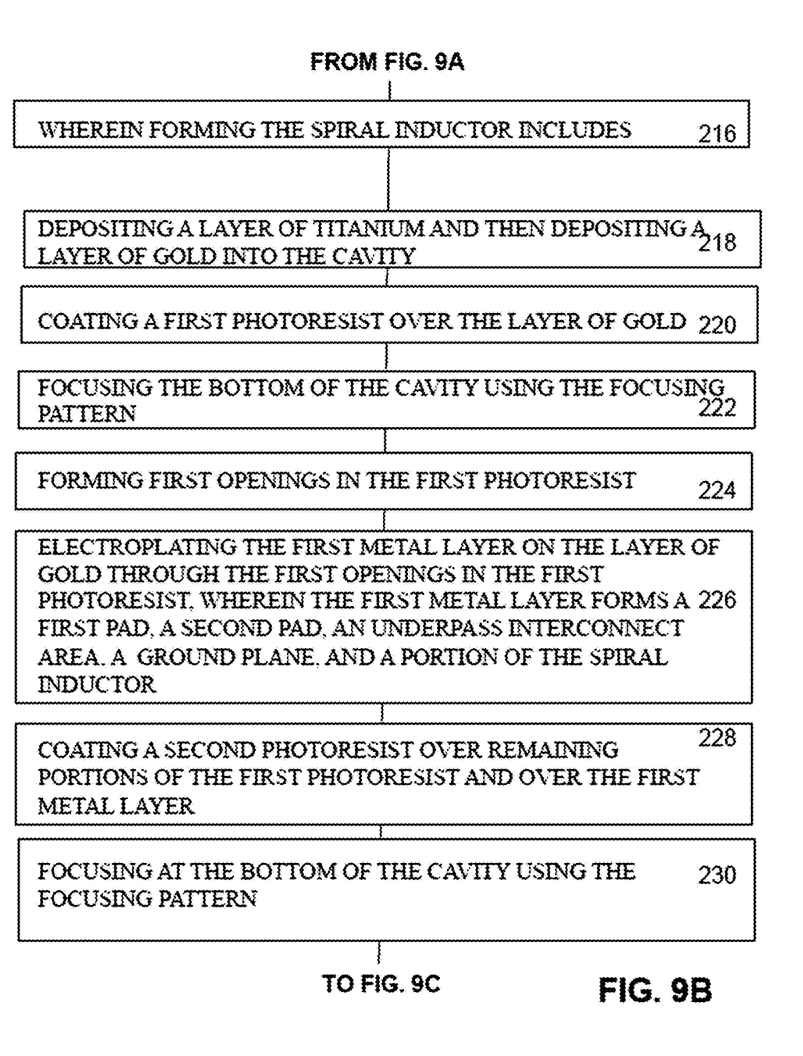
Figure 9C:
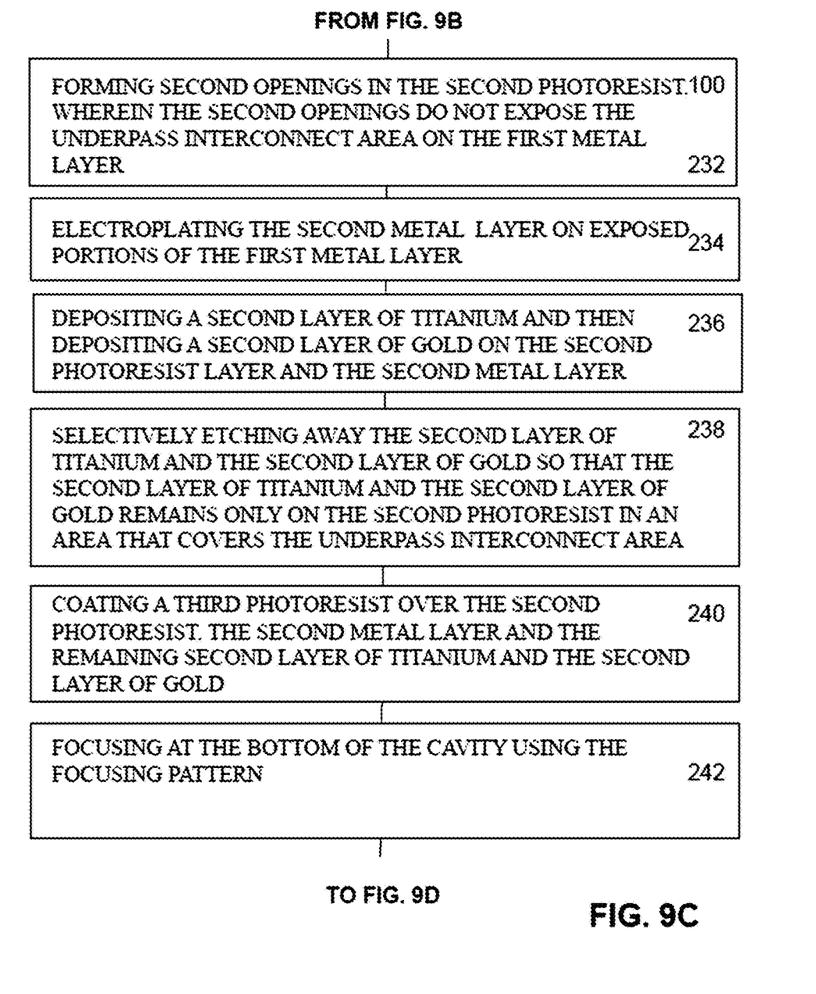
Figure 9D:
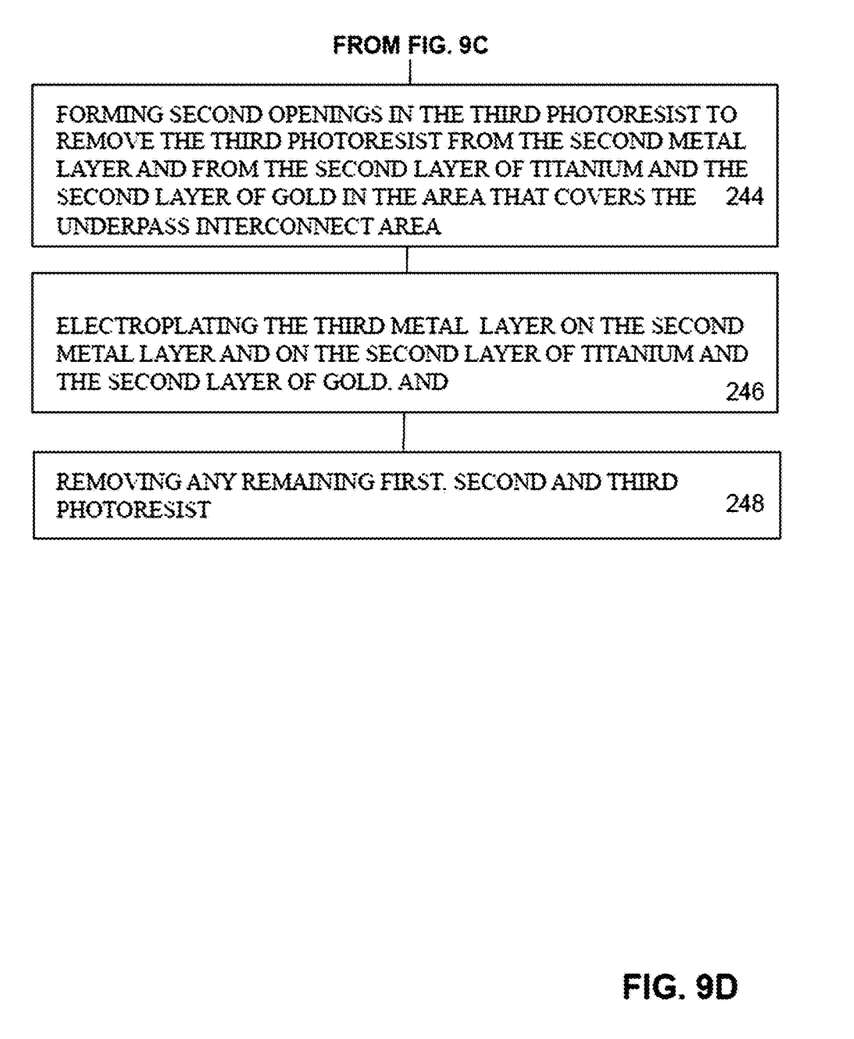

S-parameter measurements have been performed using an RF probe station with Ground-Signal-Ground probes. On-wafer calibration structures, such as Open, Short, Thru, and a series of delay lines may be utilized to de-embed the losses associated with the CPWs 50 and 52 prior to making inductor measurements. FIG. 6 shows the measured S-parameters for a 1.5 turn CPW as a function of frequency for a 1.5-turn inductor microfabricated inside a 100 µm deep silicon cavity. Inductance and quality factor values may be analytically extracted using microwave office using a 1-port measurement to ground configuration. FIG. 7 shows the measured inductance and quality factor as a function of frequency for a 1.5-turn inductor microfabricated inside a 100 µm deep silicon cavity.

An inductor peak quality factor greater than 40 has been measured at 10 GHz, with an inductance of approximately 1 nH, and self-resonant frequency at 30 GHz. Inductors varying in size and number of turns were measured and inductance values ranged from 1 to 5 nH. The experimental results are in agreement with models using a SONNET simulation package. In addition, these results are comparable with that of inductors fabricated on planar silicon wafers, demonstrating the suitability of the microfabrication approach to realize high-performance RF inductors inside deep silicon cavities.

The present disclosure demonstrates the fabrication of polymeric and metallic patterns with a feature resolution of 3 µm inside a 100-µm-deep silicon cavity. The metallic micro-structures may be achieved via either lift-off or electroplating processes. This optimized in-cavity microfabrication process may potentially be utilized for not only embedding inductors for ultra-compact subsystems for power and RF applications, but also for fabricating advanced 3-D capacitors and MEMS devices in deep trenches or cavities.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A high-resolution microfabricated feature in a deep recess comprising:
    a cavity in a substrate or wafer, wherein the cavity has a depth of 75 µm to 100 µm;
    a focusing pattern on a bottom of the cavity, wherein the focusing pattern comprises a trench formed using contact lithography; and
    a microfabrication feature formed at the bottom of the cavity using the focusing pattern to focus a high resolution lithography tool.

2. The high-resolution microfabricated feature of claim 1 wherein the microfabrication feature has a feature resolution of at least 3 µm.

3. The high-resolution microfabricated feature of claim 1 wherein the trench has a depth of 1 micron or less.

4. The high-resolution microfabricated feature of claim 1 wherein the microfabrication feature comprises a metal layer, a polymeric, a resistor, a capacitor, an inductor, or a MEMS device.

* * * * *